United States Patent
Craeye et al.

(10) Patent No.: US 12,032,047 B2
(45) Date of Patent: Jul. 9, 2024

(54) BIRDCAGE ANTENNA

(71) Applicant: UNIVERSITE CATHOLIQUE DE LOUVAIN, Louvain-la-Neuve (BE)

(72) Inventors: Christophe Craeye, Louvain-la-Neuve (BE); Chan-Sun Park, Louvain-la-Neuve (BE); Denis Tihon, Louvain-la-Neuve (BE)

(73) Assignee: UNIVERSITE CATHOLIQUE DE LOUVAIN, Louvain-la-Neuve (BE)

( * ) Notice: Subject to any disclaimer, the term of this patent is extended or adjusted under 35 U.S.C. 154(b) by 75 days.

(21) Appl. No.: 17/642,375

(22) PCT Filed: Oct. 6, 2020

(86) PCT No.: PCT/EP2020/078020
§ 371 (c)(1),
(2) Date: Mar. 11, 2022

(87) PCT Pub. No.: WO2021/069452
PCT Pub. Date: Apr. 15, 2021

(65) Prior Publication Data
US 2022/0326324 A1    Oct. 13, 2022

(30) Foreign Application Priority Data
Oct. 6, 2019    (EP) ...................... 19201584

(51) Int. Cl.
*G01V 3/00*    (2006.01)
*G01R 33/34*    (2006.01)

(52) U.S. Cl.
CPC ............... *G01R 33/34046* (2013.01)

(58) Field of Classification Search
CPC .............. G01R 33/3415; G01R 33/543; G01R 33/5659; G01R 33/36; A61B 5/055
(Continued)

(56) References Cited

U.S. PATENT DOCUMENTS 2,981,950 A * 4/1961 Skidmore ................ H01Q 7/08
343/788
4,820,985 A   4/1989 Eash
(Continued)

FOREIGN PATENT DOCUMENTS

EP    1528403 B1 * 12/2010    ......... G01R 33/4828
JP    H0531092 A    2/1993
JP    H1189812 A    4/1999

OTHER PUBLICATIONS

International Search Report and Written Opinion dated Jan. 11, 2021, for International Patent Application No. PCT/EP2020/078020.

*Primary Examiner* — Walter L Lindsay, Jr.
*Assistant Examiner* — Frederick Wenderoth
(74) *Attorney, Agent, or Firm* — KARCESKI IP LAW, PLLC (57) ABSTRACT

A radiofrequency transducer assembly includes an antenna structure of the birdcage type. This antenna structure has longitudinally extending segments, which are arranged in a cylindrical configuration around a center axis, and at least one transversally oriented circular electrical coupling between the longitudinally extending segments. An electrically conductive shield surrounds the antenna structure of the birdcage type. The radiofrequency transducer assembly comprises a pair of electrically conductive bridges between a longitudinally extending segment of the antenna structure and the electrically conductive shield, which thereby jointly form an inductive loop.

13 Claims, 10 Drawing Sheets

(58) Field of Classification Search
USPC .......................................................... 324/309
See application file for complete search history.

(56) References Cited

U.S. PATENT DOCUMENTS

| | | |
|---|---|---|
| 5,777,474 A | 7/1998 | Srinivasan |
| 2007/0247158 A1 | 10/2007 | Nistler et al. |
| 2008/0129292 A1 | 6/2008 | Leussler et al. |
| 2008/0150533 A1 | 6/2008 | Habara et al. |
| 2008/0315880 A1 | 12/2008 | Habara et al. |
| 2011/0175616 A1* | 7/2011 | Ochi .................... G01R 33/422 |
| | | 324/318 |
| 2012/0313645 A1* | 12/2012 | Biber ................ G01R 33/3692 |
| | | 324/322 |
| 2013/0300418 A1 | 11/2013 | Eberler et al. |
| 2016/0216344 A1* | 7/2016 | Habara .............. G01R 33/3453 |

\* cited by examiner

BIRDCAGE ANTENNA

CROSS-REFERENCE TO RELATED APPLICATION(S)

This is a National Stage Entry into the United States Patent and Trademark Office from International Patent Application No. PCT/EP2020/078020, filed on Oct. 6, 2020, which claims priority to European Patent Application No. EP 19201584.0, filed on Oct. 6, 2019, the entire contents of both of which are incorporated herein by reference.

FIELD OF THE INVENTION

An aspect of the invention relates to a radiofrequency transducer assembly based on an antenna structure of the birdcage type. The radiofrequency transducer assembly may be used, for example, in a magnetic resonance imaging system. A further aspect of the invention relates to a magnetic resonance imaging system comprising a radiofrequency transducer assembly, which is based on an antenna structure of the birdcage type.

BACKGROUND OF THE INVENTION

Patent publication US 2013/0300418 A1 describes a whole-body coil for a magnetic resonance tomography device that includes one or more compensation capacitors between a high-frequency antenna, which may be of the birdcage type, and a radiofrequency shield. The one or more compensation capacitors each have variable capacitance caused by a variation in a distance of the radiofrequency shield to the high-frequency antenna.

SUMMARY OF THE INVENTION

There is a need for an improved radiofrequency transducer assembly based on an antenna structure of the birdcage type that allows obtaining a radiofrequency magnetic field that is relatively homogeneous, which may improve magnetic resonance imaging.
In accordance with an aspect of the invention, there is provided a
radiofrequency transducer assembly comprising:
an antenna structure of the birdcage type having:
a set of at least three longitudinally extending segments arranged in a cylindrical configuration around a center axis; and
at least one transversally oriented circular electrical coupling between the set of at least three longitudinally extending segments; and
an electrically conductive shield that surrounds the antenna structure, wherein the radiofrequency transducer assembly comprises a pair of electrically conductive bridges between a longitudinally extending segment of the antenna structure and the electrically conductive shield, which thereby jointly form an inductive loop.

In accordance with a further aspect of the invention, there is provided a magnetic resonance imaging apparatus comprising a radiofrequency transducer assembly as defined hereinbefore.

The radiofrequency transducer assembly defined hereinbefore is particularly suited for magnetic resonance imaging. In magnetic resonance imaging, it is generally desirable to generate a rotating radiofrequency magnetic field that is relatively homogeneous. A more homogeneous rotating radiofrequency magnetic field generally improves quality of magnetic resonance imaging. The stronger the radiofrequency magnetic field is, the better the quality of imaging that can be achieved. However, a maximum specific absorption rate (SAR) that occurs in magnetic resonance imaging should be relatively low, which is based on a concern of not damaging living tissue. Thus, in magnetic resonance imaging, it is also desirable that the radiofrequency magnetic field is as strong as possible for a given maximum specific absorption rate to be respected. The radiofrequency transducer assembly defined hereinbefore allows to better meet these needs.

For the purpose of illustration, some embodiments of the invention are described in detail with reference to accompanying drawings. In this description, additional features will be presented, some of which are defined in the dependent claims, and advantages will be apparent.

DESCRIPTION OF SOME EMBODIMENTS

Figure 1:
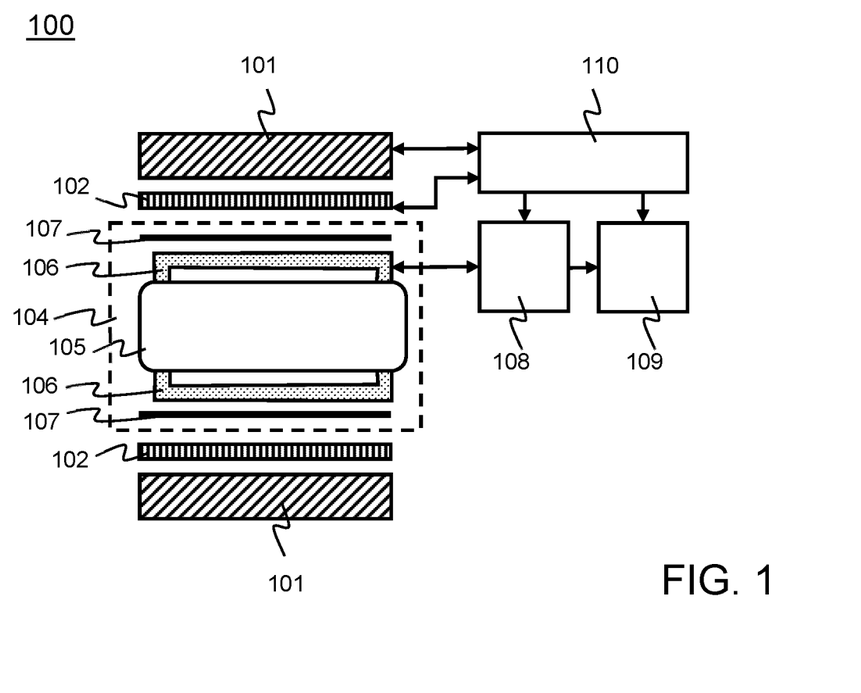
FIG. 1 is a block diagram of a magnetic resonance imaging system.

FIG. 1 schematically illustrates a magnetic resonance imaging system 100. FIG. 1 provides a block diagram of magnetic resonance imaging system 100. The magnetic resonance imaging system 100 may be used, for example, to examine a body, such as, for example, a human body or an animal body. An image of an internal structure of the body may be obtained based on magnetic resonance of atoms within the internal structure.

The magnetic resonance imaging system 100 illustrated in FIG. 1 comprises a static magnetic field generator 101, a gradient magnetic field generator 102, a radiofrequency transducer assembly 104, which are arranged around a scanning space 105. The static magnetic field generator 101 may comprise a so-called cryo-magnet, which may be a coil of conductive material that is brought into a superconductive state by cooling. The gradient magnetic field generator 102 may also comprise a coil, which may be at ambient temperature.

The radiofrequency transducer assembly 104 comprises an antenna structure of the birdcage type 106 that is surrounded by a radiofrequency shield 107. The antenna structure of the birdcage type 106 will be described in greater detail hereinafter and referred to as birdcage antenna 106 for the sake of convenience. The radiofrequency shield 107 may be in the form of, for example, a cylinder of electrically conductive material, such as a metal cylinder. The magnetic resonance imaging system 100 further comprises a radiofrequency transceiver assembly 108, which is coupled to the radiofrequency transducer assembly 104, a signal processor 109, and a controller 110.

The magnetic resonance imaging system 100 basically operates as follows. The static magnetic field generator 101 generates a relatively strong static magnetic field, which may be, for example, comprised in a range between 0.1 and 10 Tesla (T). However, stronger static magnetic fields may be possible. The gradient magnetic field generator 102 induces a gradient on the strong static magnetic field.

The radiofrequency transducer assembly 104 generates a radiofrequency magnetic field in the scanning space 105 in response to the birdcage antenna 106 receiving a drive signal from the radiofrequency transceiver assembly 108. This radiofrequency magnetic field excites nuclear spins of atoms in a body that is present in the scanning space 105. These atoms emit circularly polarized magnetic fields when their nuclear spins return to an equilibrium state. These emitted magnetic fields may be picked up by the birdcage antenna 106 or a specific reception antenna arrangement that is coupled to the radiofrequency transceiver assembly 108.

In response, the radiofrequency transceiver assembly 108 provides reception signals, which represent the magnetic fields emitted by the atoms in the body under examination. The signal processor 109 processes these reception signals so as to form an image of an internal structure of the body that is present in the scanning space 105. Given that nuclear magnetic resonance frequency depends on a local static magnetic field, the aforementioned gradient on the static magnetic field allows distinguishing between responses from different locations by treating independently different frequencies. The controller 110 may ensure an appropriate timing and control of the aforementioned functional entities.

The image that is formed on the basis of magnetic resonance, as described hereinbefore, has a quality that depends on the radiofrequency magnetic field. The more homogeneous the radiofrequency magnetic field is, the better the quality of the image will be. Moreover, the stronger the radiofrequency magnetic field is, the better the quality of the image will be for a given scanning time. It is thus desirable that the birdcage antenna 106 is capable of producing a relatively homogeneous radiofrequency magnetic field. Moreover, is desirable that this radiofrequency magnetic field is as strong as possible, while not exceeding a given maximum specific absorption rate (SAR). It is also desirable that the birdcage antenna 106 can be manufactured in a relatively simple and thus cost-effective manner.

Figure 2:
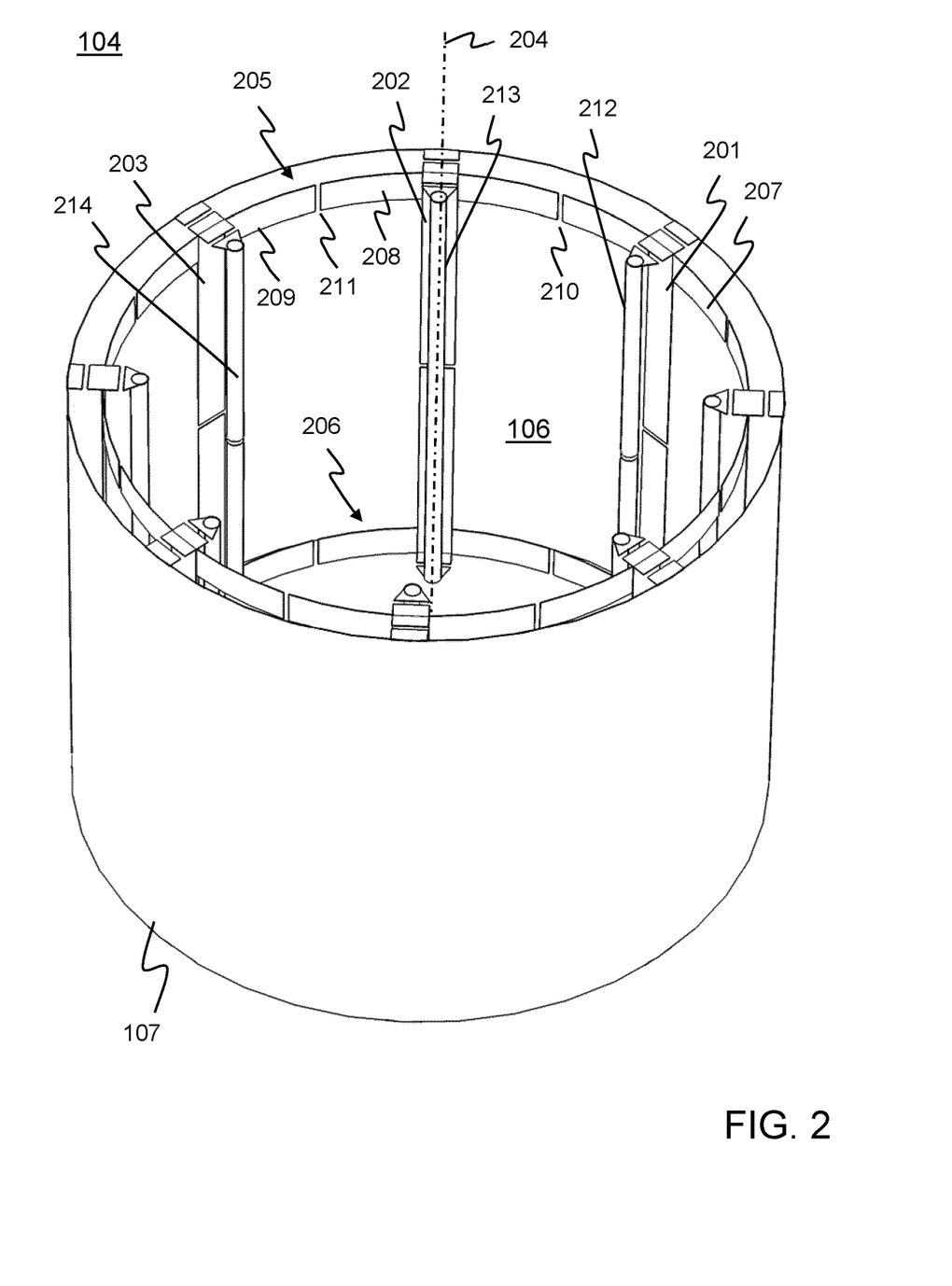
FIG. 2 is a schematic perspective view of a radiofrequency transducer assembly in the magnetic resonance imaging system comprising an antenna structure of the birdcage type, wherein electrical components in the radiofrequency transducer assembly have been omitted.
Figure 3:
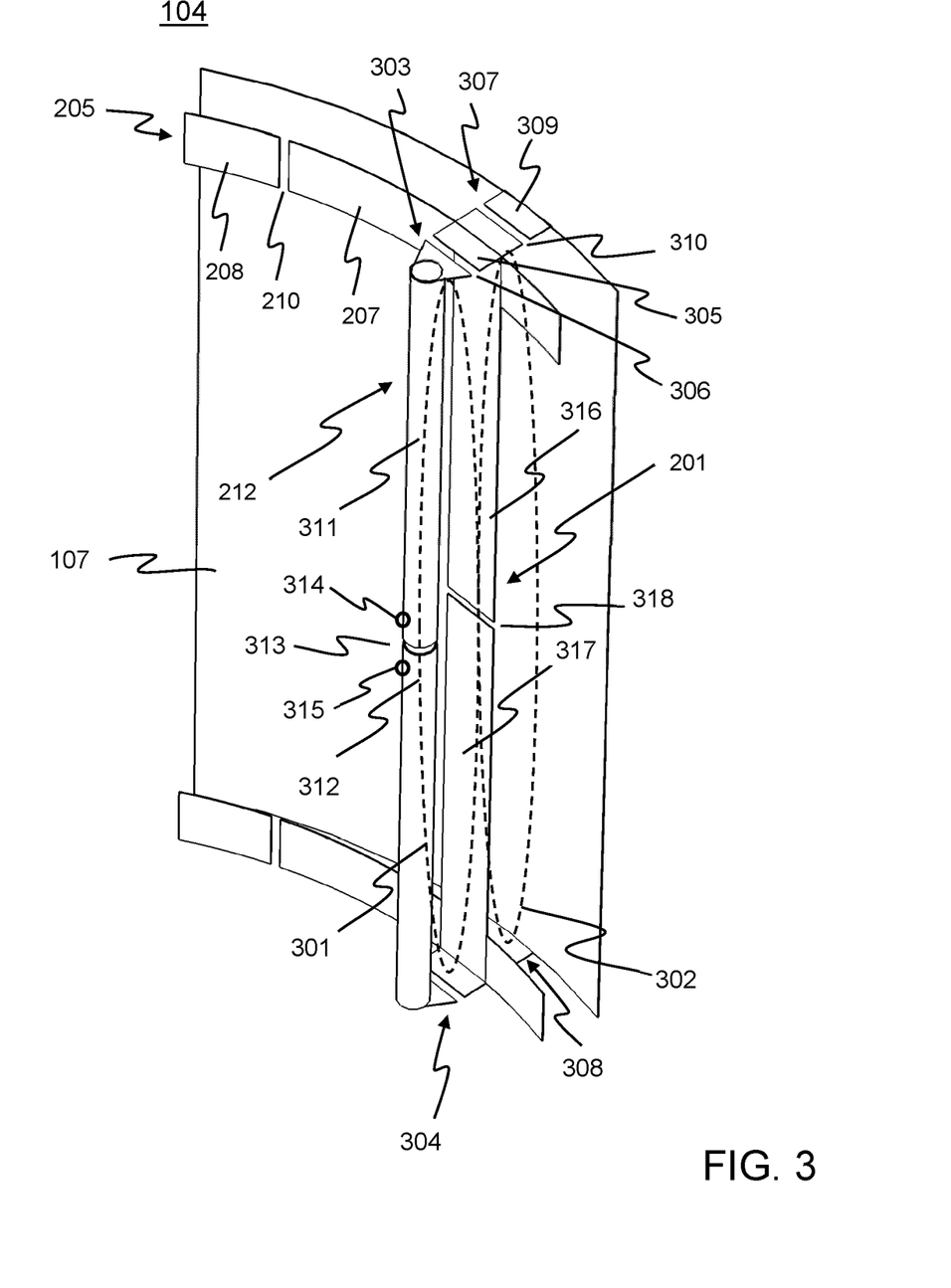
FIG. 3 is a schematic perspective view of a portion of the radiofrequency transducer assembly, wherein electrical components have been omitted.
Figure 4:
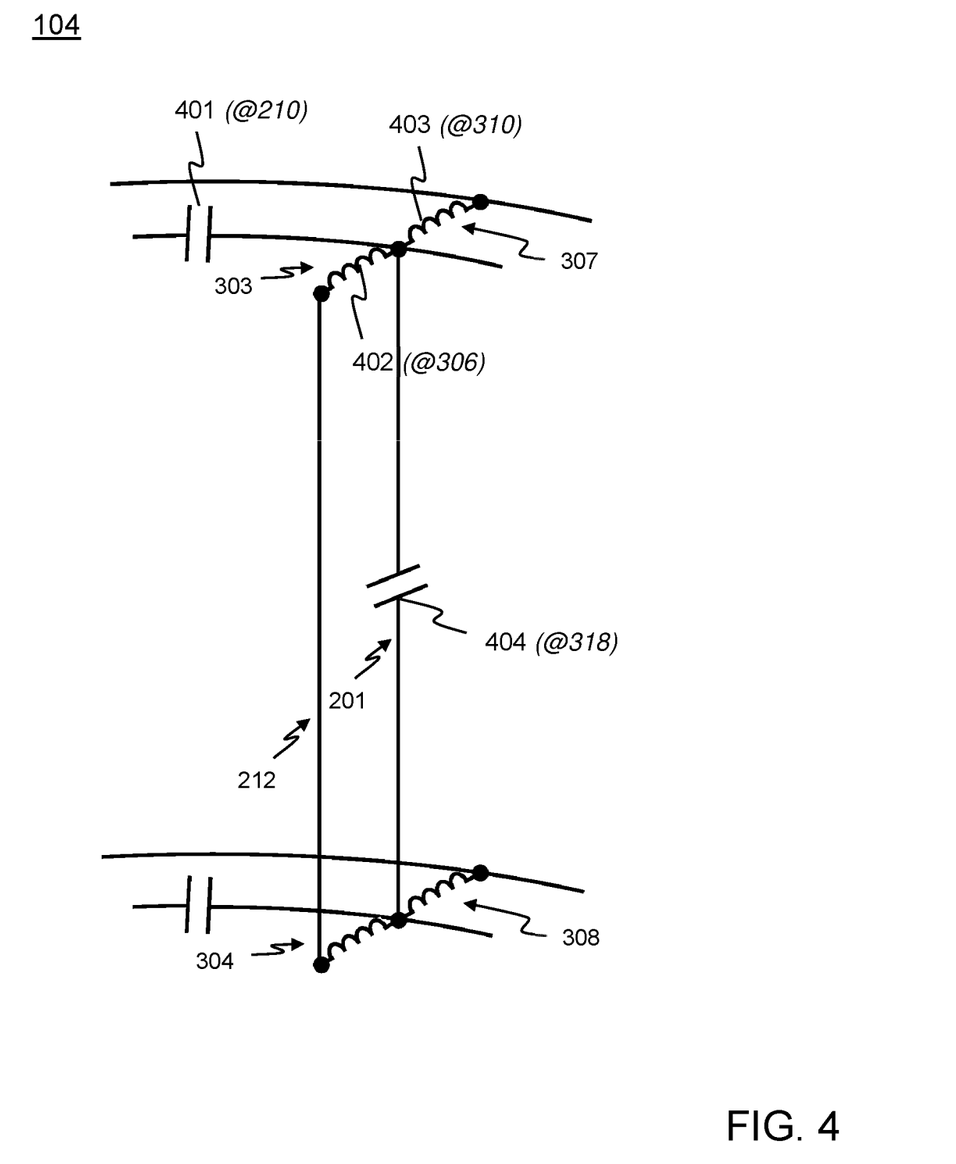
FIG. 4 is a circuit diagram of the portion of the radiofrequency transducer assembly wherein the electrical components are represented.

FIGS. 2, 3, and 4 schematically illustrate the radiofrequency transducer assembly 104 in the magnetic resonance imaging system 100. FIG. 2 provides a schematic perspective view of the radiofrequency transducer assembly 104 in its entirety, wherein electrical components in the radiofrequency transducer assembly 104 have been omitted. FIG. 3 provides a schematic perspective view of a portion of the radiofrequency transducer assembly 104, wherein electrical components have been omitted too. FIG. 4 provides a simplified circuit diagram of the portion of the radiofrequency transducer assembly 104 wherein the electrical components are represented.

The birdcage antenna 106 comprises a plurality of longitudinally extending segments, three of which are indicated by reference signs 201, 202, 203 that jointly designate all these segments in FIG. 2. These longitudinally extending segments will be referred to hereinafter as antenna legs 201, 202, 203 for the sake of convenience. The antenna legs 201, 202, 203 are arranged in a cylindrical configuration. The cylindrical configuration defines a center axis 204, which is indicated in FIG. 2. The cylindrical configuration may have a diameter comprised between, for example, 100 mm and 1000 mm. In this embodiment, the antenna legs 201, 202, 203 have a strip-like form. The antenna legs 201, 202, 203 may be formed by, for example, strips of metal. An antenna leg may have a length comprised between, for example, 100 mm and 1000 mm, and a width comprised between, for example, 10 mm and 100 mm. For example, the length of an antenna leg may be comprised between 1 to 3 times the diameter of the aforementioned cylindrical configuration. Notwithstanding, different dimensions are possible.

The birdcage antenna 106 further comprises two transversally oriented cylindrical electrical couplings 205, 206 between the plurality of antenna legs 201, 202, 203. One of these couplings will be referred to hereinafter as upper ferrule 205; the other coupling will be referred to hereinafter as lower ferrule 206 for the sake of convenience. The aforementioned ferrules 205, 206 may have a width comprised between, for example, 5 mm and 100 mm. For example, the width of a ferrule may be comprised in a range between 3% to 15% of the length of an antenna leg. Notwithstanding, different dimensions are possible.

The upper ferrule 205 and the lower ferrule 206 comprise arcuate electrically conductive sections, three of which are designated by reference signs 207, 208, 209 that jointly designate all these sections in FIG. 2. The arcuate electrically conductive sections 207, 208, 209 are separated from each other by electrically insulating gaps, two of which are designated by reference signs 210, 211 that jointly designate all these gaps. FIG. 3 illustrates such an electrically insulating gap 210 between two arcuate electrically conductive sections 207, 208 in the upper ferrule 205. A capacitive electrical component 401, which is illustrated in FIG. 4, may bridge this electrically insulating gap 210. The capacitive electrical component 401 may have a capacitance comprised between, for example, 0.1 pF and 10 pF. The aforementioned in this paragraph also applies to other arcuate electrically conductive sections in the upper ferrule 205 as well as to those in the lower ferrule 206.

The elements of the birdcage antenna 106 discussed hereinbefore may jointly be regarded as constituting a basic birdcage antenna. These elements will therefore jointly be referred to hereinafter as basic birdcage antenna for the sake of convenience.

The birdcage antenna 106 illustrated in FIGS. 2 and 3 comprises various additional elements that may improve performance. The birdcage antenna 106 comprises auxiliary longitudinally extending segments three of which are indicated by reference signs 212, 213, 214 that jointly designate all these segments in FIG. 2. These auxiliary longitudinally extending segments will be referred to hereinafter as auxiliary antenna legs 212, 213, 214 for the sake of convenience. The auxiliary antenna legs 212, 213, 214 constitute longitudinally extending electrically conductive elements that are differently positioned with respect to the center axis 204 defined by the cylindrical configuration of the antenna legs 201, 202, 203. The auxiliary antenna legs 212, 213, 214 are closer to the center axis 204 than the antenna legs 201, 202, 203. For example, the auxiliary antenna legs 212, 213, 214 may be at a distance from the center axis 204 that corresponds with about 90% of the diameter of the cylindrical configuration of the antenna legs 201, 202, 203 that belong to the basic birdcage antenna. In this embodiment, the auxiliary antenna legs 212, 213, 214 have a rod-like shape but any other shape may be suitable too.

In the birdcage antenna 106, the antenna legs 201, 202, 203 are part of inductive loops, which contributes to achieving a relatively homogeneous radiofrequency magnetic field. More specifically, as illustrated in FIG. 3, an antenna leg 201 forms part of two inductive loops 301, 302. One of these two inductive loops 301 is formed by electrically conductive coupling of the antenna leg 201 to an auxiliary antenna leg 212. The other inductive loop 302 is formed by electrically conductive coupling of the antenna leg 201 to the radiofrequency shield 107.

FIG. 3 illustrates that the antenna leg 201 is coupled to an auxiliary antenna leg 212 by means of a pair of electrically conductive bridges 303, 304, one of which will be referred to hereinafter as upper leg-leg bridge 303, and the other one as lower leg-leg bridge 304. The upper leg-leg bridge 303 comprises an inductive electrical component 402, which is represented in FIG. 4 rather than in FIG. 3 for the sake of convenience and clarity. The upper leg-leg bridge 303 further comprises an electrically conductive strip 305, which has an electrically insulating gap 306. The inductive electrical component 402, which is illustrated in FIG. 4, bridges this electrically insulating gap 306. The inductive electrical component 402 may have an inductance comprised between, for example, 0.2 nH and 0.2 µH. The electrically conductive strip 305 may have a width similar to that of the aforementioned ferrules of the basic birdcage antenna. The aforementioned in this paragraph also applies to the lower leg-leg bridge 304. The upper leg-leg bridge 303 and the lower leg-leg bridge 304 provide an inductive coupling between the antenna leg 201 and the auxiliary antenna leg 212.

FIG. 3 further illustrates that the antenna leg 201 is coupled to the radiofrequency shield 107 by means of a pair of electrically conductive bridges 307, 308 similar to those described hereinbefore. The radiofrequency shield 107 constitutes another longitudinally extending electrically conductive element that is differently positioned with respect to the center axis 204 defined by the cylindrical configuration of the antenna legs 201, 202, 203. The radiofrequency shield 107 presents a larger diameter and is thus further away from the center axis 204. One of the electrically conductive bridges 307, 308 between the antenna leg 201 and radiofrequency shield 107 will be referred to hereinafter as upper leg-shield bridge 307, and the other one as lower leg-shield bridge 308 for the sake of convenience.

The upper leg-shield bridge 307 comprises an inductive electrical component 403, which again is represented in FIG. 4 rather than in FIG. 3 for the sake of convenience and clarity. Here too, the inductive electrical component 403 may have an inductance comprised between, for example, 0.2 nH and 0.2 µH. Similar to the pair of electrically conductive bridges 303, 304 between the antenna leg 201 and the auxiliary antenna leg 212, the upper leg-shield bridge 307 comprises an electrically conductive strip 309, which has an electrically insulating gap 310. The inductive electrical component 403, which is illustrated in FIG. 4, bridges this electrically insulating gap 310. The electrically conductive strip 309 may have a width similar to that of the aforementioned ferrules 205, 206 of the basic birdcage antenna. The aforementioned in this paragraph also applies to the lower leg-shield bridge 308.

FIG. 3 further illustrates that the auxiliary antenna leg 212 comprises two electrically conductive portions 311, 312, which will be referred to hereinafter as upper leg portion 311 and lower leg portion 312 for the sake of convenience. An electrically insulating gap 313 separates the upper leg portion 311 from the lower leg portion 312. The electrically insulating gap 313 makes that the auxiliary antenna leg 212 provides a pair of signal connection points 314, 315. One signal connection point 314 is provided on the upper leg portion 311, the other signal connection point 315 is provided on the lower leg portion 312. The pair of signal connection points 314, 315 may receive the drive signal from the radiofrequency transceiver assembly 108 in the magnetic resonance imaging system 100 illustrated in FIG. 1. The pair of signal connection points 314, 315 may also provide a reception signal to the radiofrequency transceiver assembly 108 of the magnetic resonance imaging system 100 illustrated in FIG. 1.

FIG. 2 illustrates that a further auxiliary antenna leg 214 is similar to the auxiliary antenna leg 212 represented in FIG. 3 and described hereinbefore. This further auxiliary antenna leg 214 provides a further pair of signal connection points. The first mentioned auxiliary antenna leg 212, which provides the pair of signal connection points 314, 315 represented in FIG. 3, and the further auxiliary antenna leg 214, which provides the further pair of signal connection points, have a defined positional relationship with each other. In this embodiment, the defined positional relationship is characterized by a 90° angle between the aforementioned auxiliary antenna legs 212, 214 with respect to the center axis 204. That is, there is an orthogonal positional relationship. This allows generating a radiofrequency magnetic field that has a circularly polarized component.

FIG. 3 further illustrates that the antenna leg 201, which belongs to the basic birdcage antenna, also comprises two electrically conductive portions 316, 317 separated by an electrically insulating gap 318. FIG. 4 schematically illustrates a capacitive electrical component 404 that bridges this electrically insulating gap 318 in the antenna leg 201. The capacitive electrical component may have a capacitance comprised between, for example, 0.1 pF and 10 pF. In this embodiment, the aforementioned in this paragraph applies to each of the antenna legs 201, 202, 203 of the basic the birdcage antenna illustrated in FIG. 2.

Figure 5:
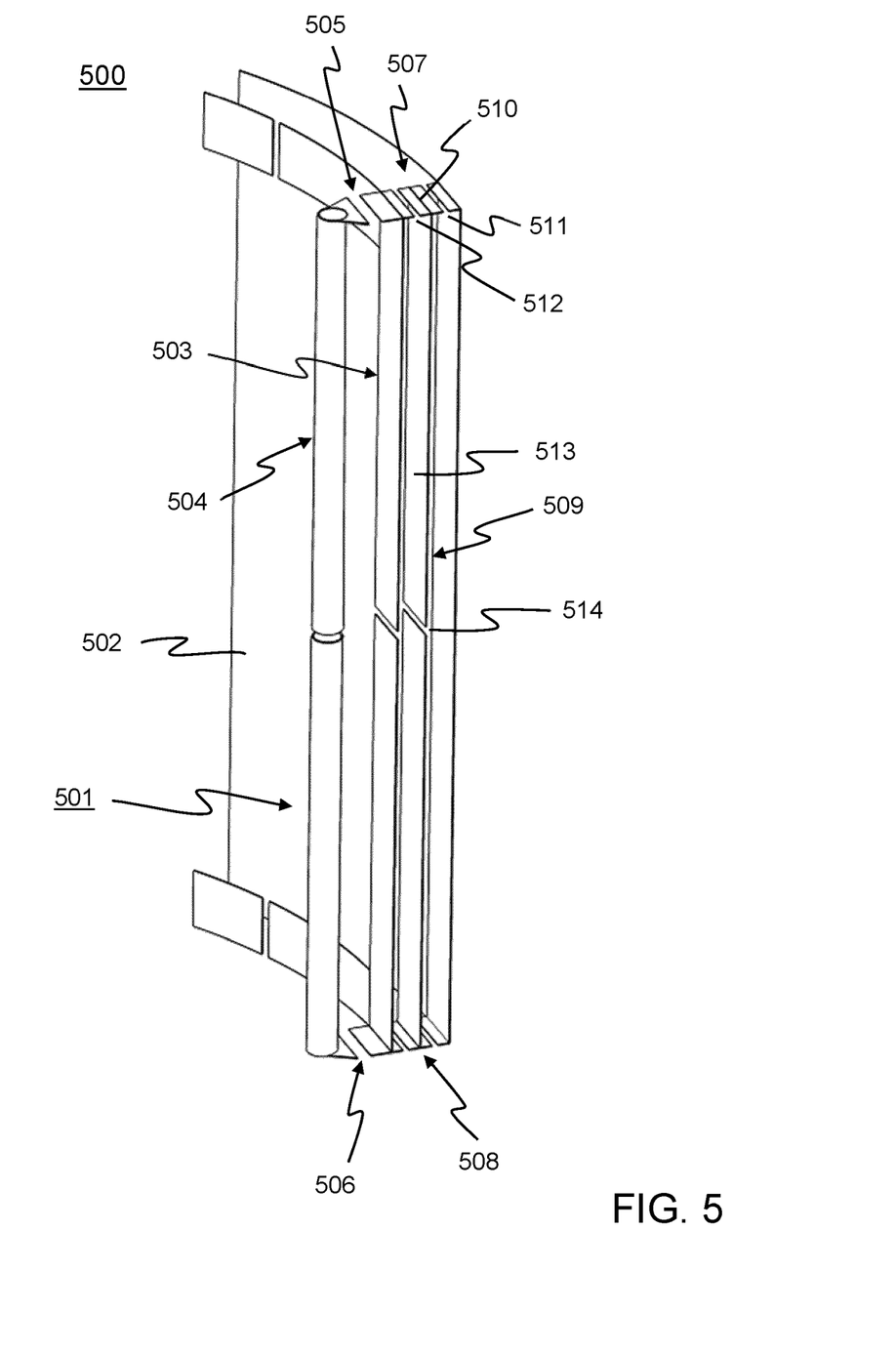
FIG. 5 is a schematic perspective view of a portion of an evolved radiofrequency transducer assembly, wherein electrical components have been omitted.
Figure 6:
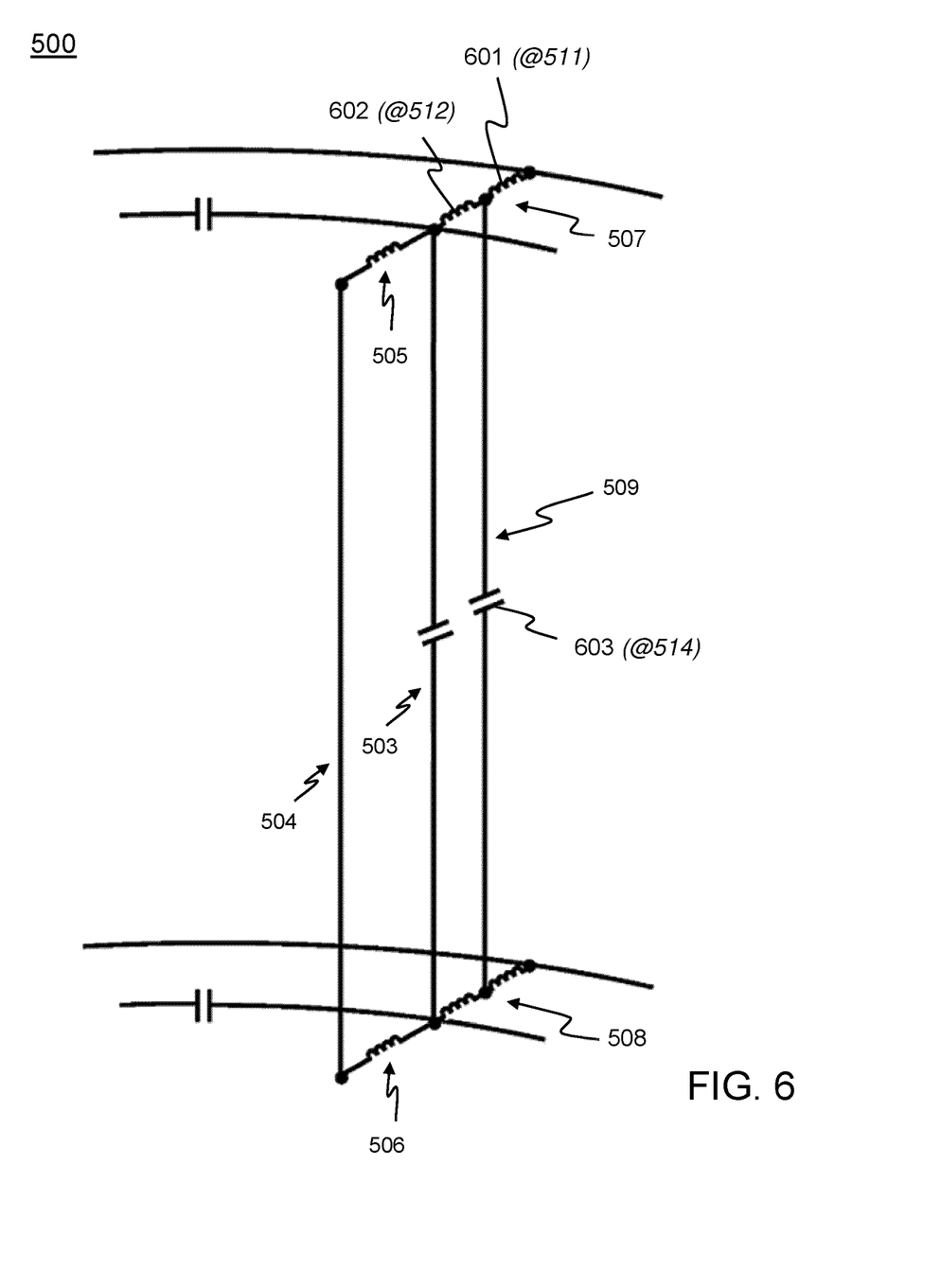
FIG. 6 is a circuit diagram of the portion of the evolved radiofrequency transducer assembly wherein the electrical components are represented.

FIGS. 5 and 6 schematically illustrate an evolved radiofrequency transducer assembly 500, which may replace the radiofrequency transducer assembly 104 in the magnetic resonance imaging system 100 illustrated in FIG. 1. FIG. 5 provides a schematic perspective view of a portion of the evolved radiofrequency transducer assembly 500, wherein electrical components have been omitted. FIG. 6 provides a simplified circuit diagram of the portion of the evolved radiofrequency transducer assembly 500 wherein the electrical components are represented.

The evolved radiofrequency transducer assembly 500 has a lot in common with the radiofrequency transducer assembly 104 described hereinbefore with reference to FIGS. 2-4. The evolved radiofrequency transducer assembly 500 also comprises a birdcage antenna 501 and a radiofrequency shield 502, which are only partially illustrated in FIG. 5. The birdcage antenna 501 of the evolved radiofrequency transducer assembly 500 may be similar to, and even identical with, the birdcage antenna 106 presented hereinbefore. For the sake of convenience and ease of explanation, this is assumed to be the case. Accordingly, the evolved radiofrequency transducer assembly 500 equally comprises an antenna leg 503 and an auxiliary antenna leg 504, which may be similar to those described hereinbefore. A pair of electrically conductive bridges 505, 506 couple the aforementioned antenna legs 503, 504 with each other. The pair of electrically conductive bridges 505, 506 may be similar to the pair of electrically conductive bridges 303, 304 in the radiofrequency transducer assembly 104 described hereinbefore.

What makes the evolved radiofrequency transducer assembly 500 distinct from the radiofrequency transducer assembly 104 is the manner in which the antenna leg 503 is coupled to the radiofrequency shield 502. The evolved radiofrequency transducer assembly 500 comprises a pair of evolved electrically conductive bridges 507, 508 that is somewhat different from the pair of electrically conductive bridges 307, 308 described hereinbefore. Moreover, a capacitive coupling 509 is provided between one evolved electrically conductive bridge 507 of the pair of evolved electrically conductive bridges 507, 508 and the other evolved electrically conductive bridge 508 of the pair. The pair of evolved electrically conductive bridges 507, 508 with the capacitive coupling 509 is electrically similar to a transmission line between the antenna leg 503 and the radiofrequency shield 502. One evolved electrically conductive bridge 507 of the pair of evolved electrically conductive bridges 507, 508 will be referred to hereinafter as evolved upper leg-shield bridge 507, and the other one as evolved lower leg-shield bridge 508.

In this embodiment, the evolved upper leg-shield bridge 507 comprises two inductive electrical components 601, 602 arranged in series, which are represented in FIG. 6 rather than in FIG. 5 for the sake of convenience and clarity. The evolved upper leg-shield bridge 507 further comprises an electrically conductive strip 510, which has two electrically insulating gaps 511, 512. One 601 of the two inductive electrical components 601, 602, which are illustrated in FIG. 6, bridges one 511 of the two electrically insulating gaps 511, 512, the other inductive electrical component 602 bridges the other electrically insulating gap 512 in the electrically conductive strip 510. The aforementioned in this paragraph also applies to the evolved lower leg-shield bridge 508.

The capacitive coupling 509 comprises a capacitor 603, which is represented in FIG. 6 rather than in FIG. 5 for the sake of convenience and clarity. The capacitor 603 may be a discrete component. The capacitive coupling 509 further comprises an electrically conductive strip 513 that has an electrically insulating gap 514, as illustrated in FIG. 5. The capacitor 603 illustrated in FIG. 6 bridges this electrically insulating gap 514.

Figure 7:
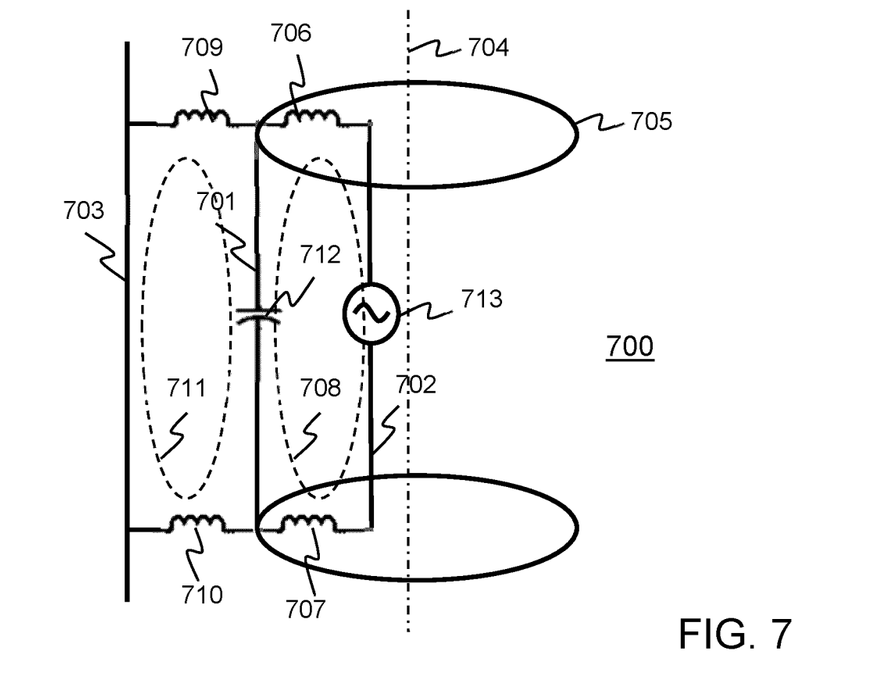
FIG. 7 is a circuit diagram of a basic topology that characterizes the radiofrequency transducer assembly.

FIG. 7 illustrates a basic topology 700 that characterizes the radiofrequency transducer assembly 104 presented hereinbefore with reference to FIGS. 2, 3, and 4. FIG. 7 provides a simplified circuit diagram of the basic topology 700. The basic topology 700 comprises an antenna leg 701 that belongs to a basic birdcage antenna, an auxiliary antenna leg 702, and a radiofrequency shield 703. The auxiliary antenna leg 702 and the radiofrequency shield 703 each constitute a longitudinally extending electrically conductive element that is differently positioned with respect to a center axis 704 of a cylindrical configuration 705 of the antenna leg 701 and further antenna legs that constitute a basic birdcage antenna. Differently positioned means that the elements concerned 702, 703 present a different distance or radius with respect to the center axis 704.

A pair of inductive couplings 706, 707 is provided between the antenna leg 701 and the auxiliary antenna leg 702, which provides an inductive loop 708. A pair of inductive couplings 709, 710 is also provided between the antenna leg 701 and the radiofrequency shield 703, which provides a further inductive loop 711. The antenna leg 701 that belongs to the basic birdcage antenna may comprise an electrically insulating gap with a capacitive bridge 712. A drive signal 713 may be applied to the auxiliary antenna leg 702.

Figure 8:
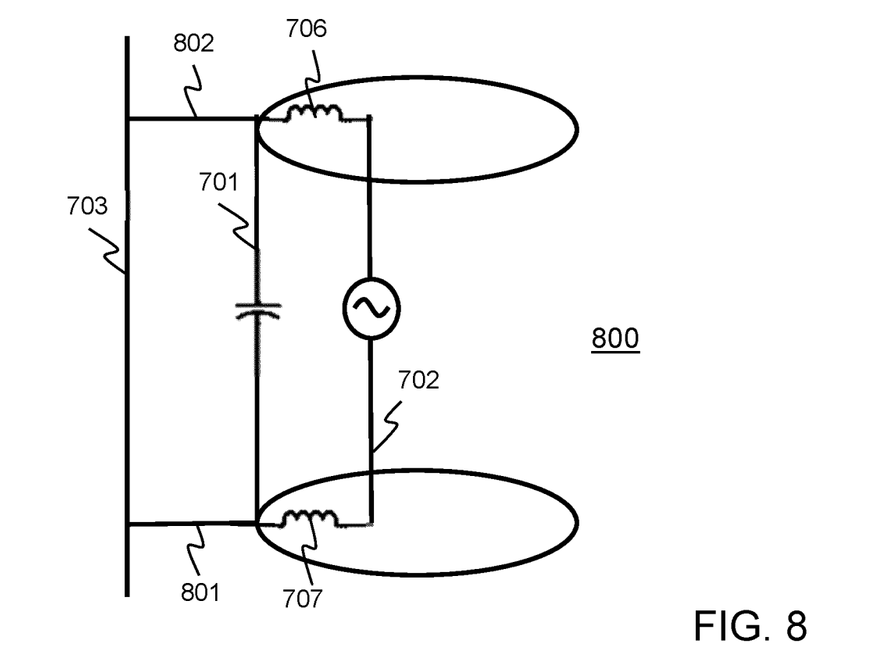
FIG. 8 is a circuit diagram of a first alternative basic topology for a radiofrequency transducer assembly.

FIG. 8 schematically illustrates a first alternative basic topology 800 for a radiofrequency transducer assembly. FIG. 8 provides a simplified circuit diagram of the first alternative basic topology 800, which may be obtained by applying the following modification to the basic topology 700 illustrated in FIG. 7. The pair of inductive couplings 709, 710 between the antenna leg 701 and the radiofrequency shield 703 represented in FIG. 7 is replaced by a pair of basic electrically conductive couplings 801, 802, represented in FIG. 8. Like in the basic topology 700 illustrated in FIG. 7, the first alternative basic topology 800 comprises the pair of inductive couplings 706, 707 that is provided between the antenna leg 701 and the auxiliary antenna leg 702.

Figure 9:
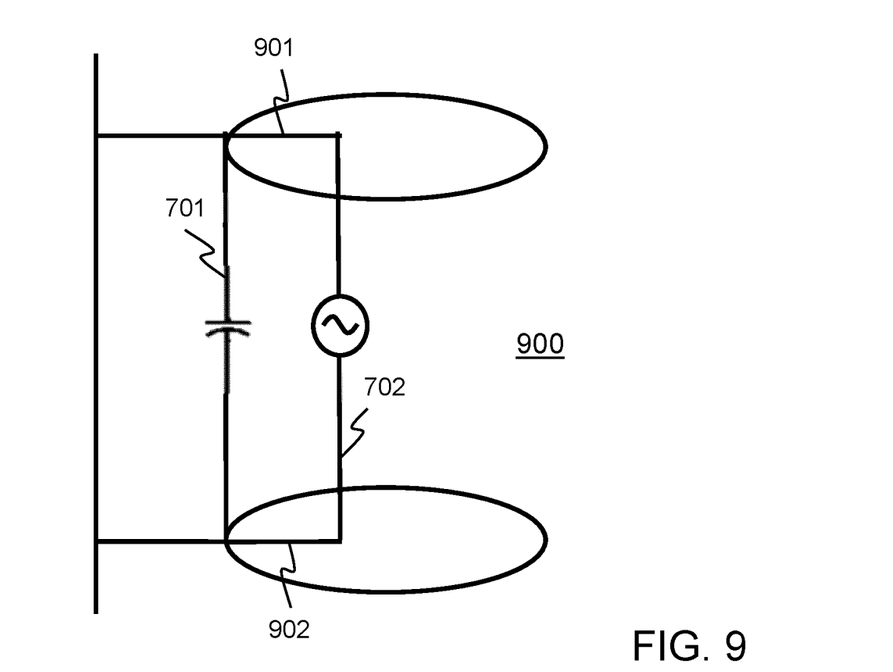
FIG. 9 is a circuit diagram of a second alternative basic topology for a radiofrequency transducer assembly.

FIG. 9 schematically illustrates a second alternative basic topology 900 for a radiofrequency transducer assembly. FIG. 9 provides a simplified circuit diagram of the second alternative basic topology 900, which may be obtained by applying the following modification to the first alternative topology illustrated in FIG. 8. The pair of inductive couplings 706, 707 between the antenna leg 701 and the auxiliary antenna leg 702 represented in FIG. 8 is replaced by a pair of basic electrically conductive couplings 901, 902, represented in FIG. 9.

Figure 10:
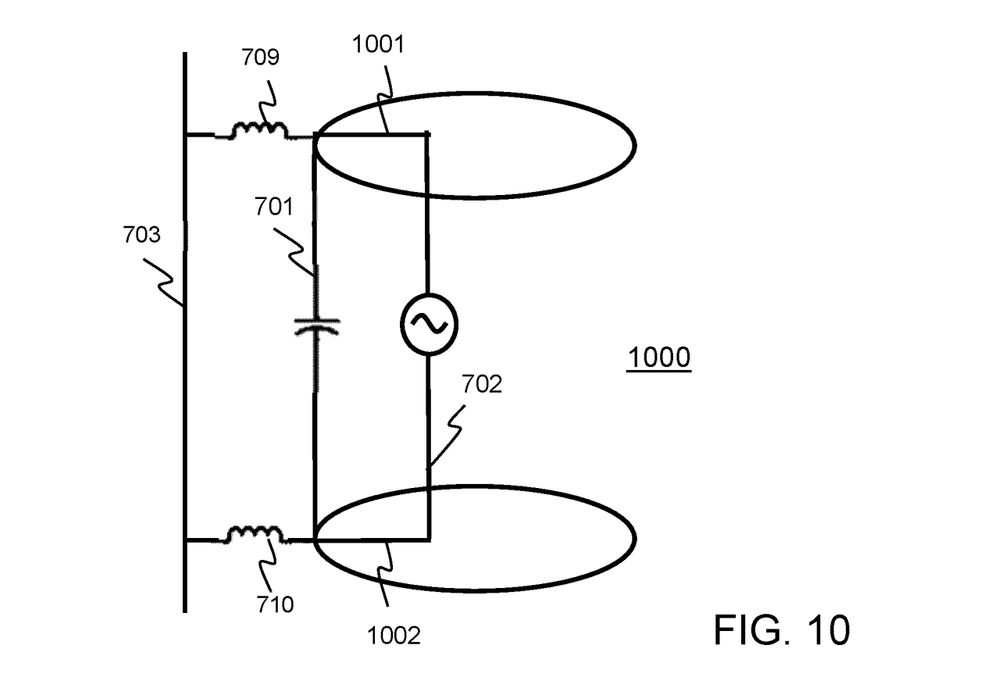
FIG. 10 is a circuit diagram of a third alternative basic topology for a radiofrequency transducer assembly.

FIG. 10 schematically illustrates a third alternative basic topology 1000 for a radiofrequency transducer assembly. FIG. 10 provides a simplified circuit diagram of the third alternative basic topology 1000, which may be obtained by applying the following modification to the basic topology 700 illustrated in FIG. 7. The pair of inductive couplings 706, 707 between the antenna leg 701 and the auxiliary antenna leg 702 represented in FIG. 7 is replaced by a pair of basic electrically conductive couplings 1001, 1002, represented in FIG. 10. Like in the basic topology 700 illustrated in FIG. 7, the third alternative basic topology 1000 comprises the pair of inductive couplings 709, 710 that is provided between the antenna leg 701 and the radiofrequency shield 703.

Figure 11:
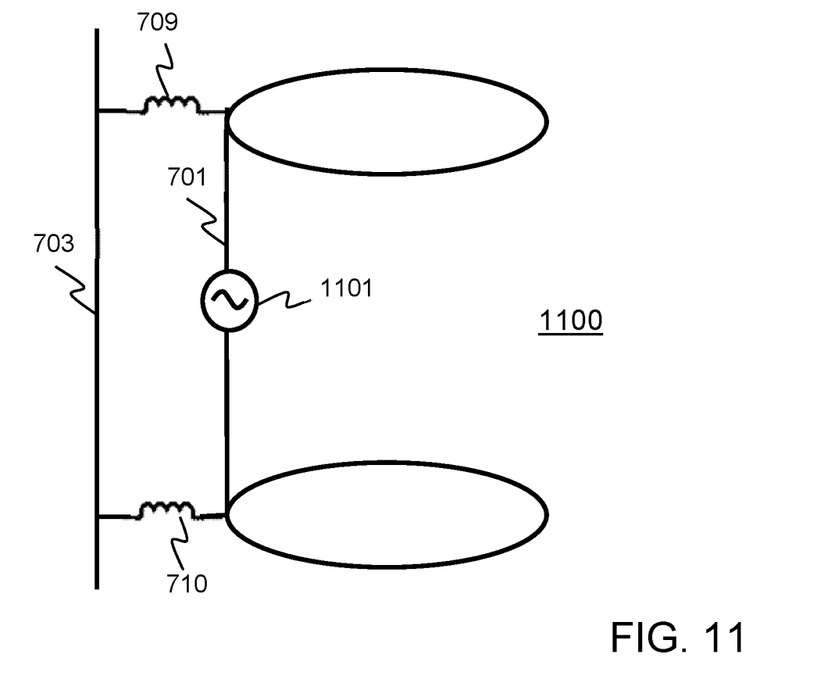
FIG. 11 is a circuit diagram of a fourth alternative basic topology for a radiofrequency transducer assembly.

FIG. 11 schematically a fourth alternative basic topology 1100 for a radiofrequency transducer assembly. FIG. 11 provides a simplified circuit diagram of the fourth alternative basic topology 1100, which may be obtained by applying the following modification to the basic topology 700 illustrated in FIG. 7. The auxiliary antenna leg 702 represented in FIG. 7 is removed, as well as the pair of inductive couplings 706, 707 between the antenna leg 701 and auxiliary antenna leg 702. A drive signal 1101 may be applied to the antenna leg 701 that belongs to the basic birdcage antenna. Like in the basic topology 700 illustrated in FIG. 7, the fourth alternative basic topology 1100 comprises the pair of inductive couplings 709, 710 that is provided between the antenna leg 701 and the radiofrequency shield 703.

Concerning the basic topology 700, the third and the fourth alternative basic topologies 1000, 1100, illustrated in FIGS. 7, 10, and 11, respectively, it should be noted that a capacitive coupling may be provided between the pair of inductive couplings 709, 710 between the antenna leg 701 and the radiofrequency shield 703. In such further topologies, the pair of inductive couplings 709, 710 with the capacitive coupling are electrically similar to a transmission line between the antenna leg 701 and the radiofrequency shield 703.

The radiofrequency transducer assembly 104 presented hereinbefore with reference to FIGS. 2, 3, and 4 may thus be modified in accordance with any of the alternative basic topologies presented hereinbefore with reference to FIGS. 8-11. The evolved radiofrequency transducer assembly 500 presented hereinbefore with reference to FIGS. 5 and 6 may be modified similarly.

Figure 12:
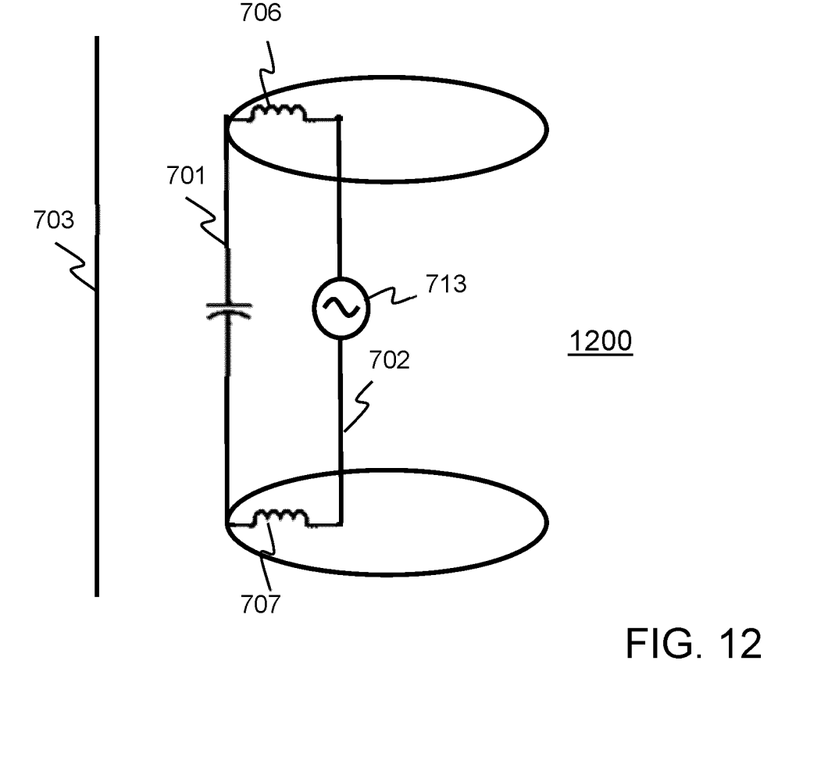
FIG. 12 is a circuit diagram of a fifth alternative basic topology for a radiofrequency transducer assembly.

FIG. 12 illustrates a fifth alternative basic topology 1200 for a radiofrequency transducer assembly. FIG. 12 provides a simplified circuit diagram of the fifth alternative topology, which may be obtained by applying the following modification to the basic topology 700 illustrated in FIG. 7. The pair of inductive couplings 709, 710 between the antenna leg 701 and the radiofrequency shield 703 represented in FIG. 7 is removed. Like in the basic topology 700 illustrated in FIG. 7, the fifth alternative basic topology 1200 comprises the auxiliary antenna leg 702 as well as the pair of inductive couplings 706, 707 that is provided between the antenna leg 701 and the auxiliary antenna leg 702. The drive signal 713 may be applied to the auxiliary antenna leg 702.

Figure 13:
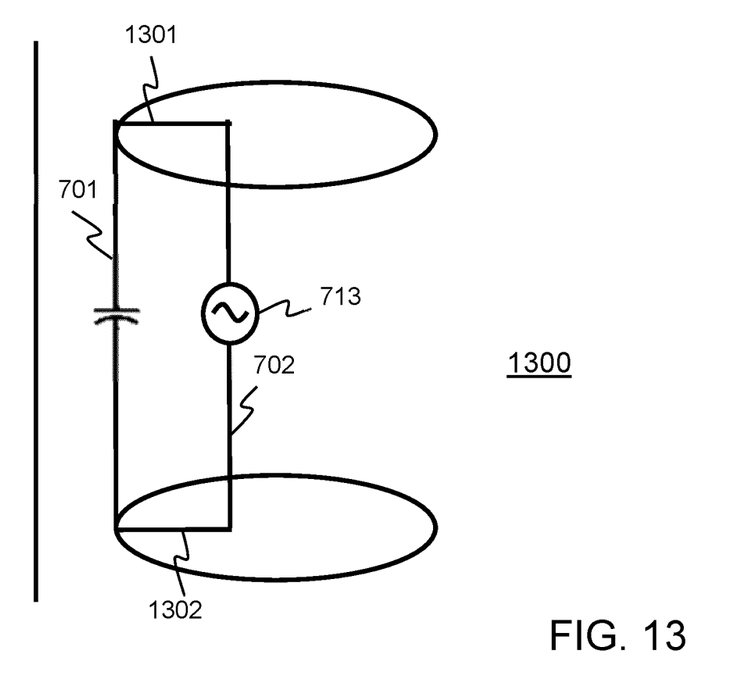
FIG. 13 is a circuit diagram of a sixth alternative basic topology for a radiofrequency transducer assembly.

FIG. 13 illustrates a sixth alternative basic topology 1300 for a radiofrequency transducer assembly. FIG. 13 provides a simplified circuit diagram of the sixth alternative basic topology 1300, which may be obtained by applying the following modification to the fifth alternative basic topology 1200 illustrated in FIG. 12. The pair of inductive couplings 706, 707 between the antenna leg 701 and the auxiliary antenna leg 702 represented in FIG. 12 is replaced by a pair of basic electrically conductive couplings 1301, 1302, represented in FIG. 13. Like in the fifth alternative basic topology 1200, the drive signal 713 may be applied to the auxiliary antenna leg 702.

The embodiments described hereinbefore with reference to the drawings are presented by way of illustration. The invention may be implemented in numerous different ways. In order to illustrate this, some alternatives are briefly indicated.

The invention may be applied in numerous types of products or methods related to magnetic resonance imaging, or other applications that require a relatively homogeneous radiofrequency magnetic field.

There are numerous different ways of implementing a radiofrequency transducer assembly in accordance with the invention. For example, referring to the embodiments illustrated in FIGS. 7-11, any of the pairs of inductive couplings 706, 707 and 709, 710 may be replaced by an inductive coupling combined with a basic conductive coupling in the form of, for example, a strip, a wire, or any other differently shaped conductive element. In the embodiment described with reference to FIGS. 2-4, the birdcage antenna 106 comprises two pairs of signal connection points that have a 90° positional relationship with respect to each other. In other embodiments, a birdcage antenna may comprise only one pair of signal connection points, or three or more pairs of signal connection points. Moreover, in case there are multiple pairs of signal connection points, these may have a positional relationship with respect to each other different from 90°. For example, an embodiment of a birdcage antenna may comprise three pairs of signal connection points that have a 60° positional relationship with respect to each other.

The term "cylindrical configuration" should be understood in a broad sense. The term may embrace any configuration that allows a plurality of longitudinally extending segments to surround an inner volume of a birdcage antenna. For example, the cylindrical configuration may present an oval circumference, or a round circumference.

There are numerous different ways of implementing a longitudinally extending electrically conductive element that forms part of a birdcage antenna. Such a longitudinally extending electrically conductive element may have any suitable form and shape, different from what has been presented by way of example in the embodiments described with reference to FIGS. 2-6. A shield surrounding a birdcage antenna may comprise holes or slots, rather than presenting a continuous electrically conductive segment or surface.

There are numerous different ways of implementing an electrically conductive coupling to form an inductive loop in a radiofrequency transducer assembly in accordance with the invention. In the embodiment described with reference to FIGS. 2-4, the electrically conductive coupling is in the form of a strip with a gap bridged by an electrical component. In other embodiments, an electrically conductive coupling may comprise a different form of conductor, such as, for example, a wire or a tube. Moreover, an electrically conductive coupling may incorporate multiple electrical components. Furthermore, there are numerous different ways of incorporating one or more electrical components in an electrically conductive coupling, such as, for example, by soldering, by screwing or by using conductive glue.

In general, there are numerous different ways of implementing the invention, whereby different implementations may have different topologies. In any given topology, a single entity may carry out several functions, or several entities may jointly carry out a single function. In this respect, the drawings are very diagrammatic.

The remarks made hereinbefore demonstrate that the embodiments described with reference to the drawings illustrate the invention, rather than limit the invention. The invention can be implemented in numerous alternative ways that are within the scope of the appended claims. All changes that come within the meaning and range of equivalency of the claims are to be embraced within their scope. Any reference sign in a claim should not be construed as limiting the claim. The verb "comprise" in a claim does not exclude the presence of other elements or other steps than those listed in the claim. The same applies to similar verbs such as "include" and "contain". The mention of an element in singular in a claim pertaining to a product, does not exclude that the product may comprise a plurality of such elements. Likewise, the mention of a step in singular in a claim pertaining to a method does not exclude that the method may comprise a plurality of such steps. The mere fact that respective dependent claims define respective additional features, does not exclude combinations of additional features other than those reflected in the claims.

The invention claimed is:

1. An MRI transducer assembly, MRI being an acronym for magnetic resonance imaging, the MRI transducer assembly comprising:
   an antenna structure of the birdcage type having:
      a set of at least three longitudinally extending segments arranged in a cylindrical configuration around a center axis; and at least one transversally oriented circular electrical coupling between the set of at least three longitudinally extending segments;

an electrically conductive shield that surrounds the antenna structure, and an electrical coupling between the antenna structure and the electrically conductive shield wherein the electrical coupling comprises:

a pair of electrically conductive bridges between a longitudinally extending segment of the antenna structure and the electrically conductive shield, which thereby jointly form an inductive loop; and a capacitive coupling between one electrically conductive bridge of the pair of electrically conductive bridges and the other electrically conductive bridge of the pair so that the pair of electrically conductive bridges with the capacitive coupling is electrically similar to a transmission line between the longitudinally extending segment of the antenna structure and the electrically conductive shield.

2. An MRI transducer assembly according to claim 1, wherein the pair of electrically conductive bridges comprises at least one inductive electrical component.

3. An MRI transducer assembly according to claim 2, wherein at least one electrically conductive bridge of the pair of electrically conductive bridges comprises at least two electrically conductive segments arranged in series and separated from each other by at least one electrically insulating gap, whereby the at least one inductive electrical component bridges the at least one electrically insulating gap.

4. An MRI transducer assembly according to claim 1, wherein the pair of electrically conductive bridges comprises at least one electrically conductive strip.

5. An MRI transducer assembly according to claim 1, wherein the capacitive coupling comprises two electrically conductive segments arranged in series and separated from each other by an electrically insulating gap, and a capacitor bridging the electrically insulating gap.

6. An MRI transducer assembly according to claim 1, wherein the antenna structure comprises:

an auxiliary longitudinally extending segment closer to the center axis than the longitudinally extending segment; and an auxiliary pair of electrically conductive bridges between the longitudinally extending segment and the auxiliary longitudinally extending segment, which jointly form an auxiliary inductive loop within the radiofrequency transducer assembly;

7. An MRI transducer assembly according to claim 6, wherein the auxiliary pair of electrically conductive bridges comprises at least one inductive electrical component.

8. An MRI transducer assembly according to claim 7, wherein at least one auxiliary electrically conductive bridge of the pair of auxiliary electrically conductive bridges comprises at least two electrically conductive segments arranged in series and separated from each other by at least one electrically insulating gap, whereby the at least one inductive electrical component bridges the at least one electrically insulating gap.

9. An MRI transducer assembly according to claim 6, wherein the auxiliary longitudinally extending segment comprises two electrically conductive portions separated by an electrically insulating gap, the auxiliary longitudinally extending segment comprising a pair of signal connection points one of which is provided on one of the two electrically conductive portions, the other signal connection point being provided on the other electrically conductive portion.

10. An MRI transducer assembly according to claim 9, wherein a further auxiliary longitudinally extending segment comprises two electrically conductive portions separated by an electrically insulating gap, the further auxiliary longitudinally extending segment comprising a further pair of signal connection points, one of which is provided on one of the two electrically conductive portions, the other signal connection point being provided on the other electrically conductive portion.

11. An MRI transducer assembly according to claim 1, wherein a longitudinally extending segment of the set of at least three longitudinally extending segments comprises two electrically conductive portions separated by an electrically insulating gap, whereby a capacitive electrical component bridges the electrically insulating gap.

12. An MRI transducer assembly according to any of claim 11, wherein the transversally oriented circular electrical coupling comprises at least two arcuate electrically conductive sections that are separated from each other by an electrically insulating gap, whereby a capacitive electrical component bridges the electrically insulating gap.

13. A magnetic resonance imaging apparatus comprising an MRI transducer assembly according to claim 1.

* * * * *